United States Patent [19]
Sano et al.

[11] Patent Number: 5,867,113
[45] Date of Patent: Feb. 2, 1999

[54] VARIABLE LENGTH CODE DECODING APPARATUS HAVING PARALLEL START CODE AND SHIFT OPERATIONS

[75] Inventors: Fumihiko Sano; Takayoshi Shimazawa, both of Yokohama; Goichi Ootomo, Kawasaki, all of Japan

[73] Assignee: Kabushiki Kaisha Toshiba, Tokyo, Japan

[21] Appl. No.: 743,971

[22] Filed: Oct. 30, 1996

[30]  Foreign Application Priority Data

Oct. 31, 1995  [JP]  Japan .................................... 7-283970

[51] Int. Cl.⁶ .............................. H04L 7/00; G06F 3/00
[52] U.S. Cl. ................................................ 341/67; 341/50
[58] Field of Search ................................ 341/50, 65, 67; 348/469, 473

[56]  References Cited

U.S. PATENT DOCUMENTS

| | | | |
|---|---|---|---|
| 5,414,468 | 5/1995 | Lee | 348/402 |
| 5,566,089 | 10/1996 | Hoogenboom | 364/514 A |
| 5,583,562 | 12/1996 | Birch et al. | 348/12 |
| 5,642,437 | 6/1997 | Laczko, Sr. et al. | 382/246 |

*Primary Examiner*—Howard L. Williams
*Assistant Examiner*—Peguy Jean Pierre
*Attorney, Agent, or Firm*—Loeb & Loeb LLP

[57]  ABSTRACT

The proposed variable length coder can detect the start codes appropriately, while reducing the circuit scale thereof. The variable length code decoding apparatus, comprises: an interface section (2) having a plurality of registers (R20, R21, R22) each having a predetermined number of bits, for storing variable length code data in each of the registers in first-in first-out status; a shift circuit (3) for receiving data transferred from a predetermined number of the adjacent registers of the interface section and for shifting the received data by a number of bits corresponding to an applied shift signal, to select a start code head; and a start code detecting circuit (6) for executing detection operation by receiving data supplied from a predetermined number of the adjacent registers of the interface section, by detecting presence or absence of a start code on the basis the received data kept in byte-aligned status to output a start code presence and absence signal, and by outputting a start code shift length signal indicative of a byte from which a head bit of the start code begins in unit of byte, the start code shift length signal being applied to the shift circuit as the shift signal.

16 Claims, 4 Drawing Sheets

VARIABLE LENGTH CODE DECODING APPARATUS HAVING PARALLEL START CODE AND SHIFT OPERATIONS

BACKGROUND OF THE INVENTION

1. Field of the Invention

The present invention relates to a variable length code decoding apparatus.

2. Description of the Prior Art

Conventionally, various picture data compression techniques have been adopted. In any of these picture data compression techniques, picture data once compressed are used again after having been returned to the original picture data by extending the compressed picture data.

As one of the picture data compression and extension techniques, there exists a moving picture data compression and extension technique referred to as MPEG2 (ISO/IEC 13818-2) standard. Although not described in detail herein because being well known, this standard is disclosed in [Latest MPEG Textbook] by Hiroshi FUJIWARA, 1st Edition, Published by ASCII Publication Department on Aug. 1, 1994, for instance.

FIG. 3 is a block diagram showing an example of a decoding circuit for decoding coded signals coded compressed in accordance with the MPEG standard. In the circuit shown in FIG. 3, a vdv buffer (DRAM) is added for explanation to a circuit disclosed by [Data Compression and Digital Modulation] of NIKKEI ELECTRONICS BOOKS, on page 96, Published by NIKKEI BP Corp. Oct. 10, 1993.

This circuit operates as follows: when intra-frames obtained by coding intra-frame picture signals are decoded, a switch $SW_1$ is switched to the "a" side. On the other hand, when predicted-frames/interpolated frames obtained by coding inter-frame picture signals are decoded, the switch $SW_1$ is switched to the "b" side to add the differential picture data to the predicted picture data. In the case of the predicted frame decoding, since the switch $SW_1$ is set to the "b" side, the decoded picture data are stored in a frame memory A at the same time when outputted. In this case, the picture data stored in the frame memory A are transferred to a frame memory B. Further, in the case of the interpolated frame decoding, a switch $SW_2$ is set to any position of "c", "e" and "d" according to the frame prediction direction (forward /backward /both forward and backward).

When the coded signals compressed as described above are decoded, start codes are used. In more detail, since the compressed picture data are of hierarchical construction, a start code corresponding to each hierarchy is always placed at the start of each hierarchy. Therefore, when picture data are decoded, it is necessary to detect the start codes accurately. Here, two positions at which the start codes are detected can be considered in the circuit shown in FIG. 3. One position is a node "a" immediately before picture data (coded signals) are inputted to a so-called decoder body, and the other position is a node "b" immediately before the start codes are used for processing. In the case of the detection at the node "a", when the start code is byte-aligned, the start codes can be detected by use of a small-scaled circuit construction. In this case, however, since these detected start codes are once stored in the vdv buffer, a circuit for predicting the time at which the detected start codes are to be used is required. Further, where a plurality of start codes are stored in the vdv buffer, a circuit for deciding which detected output corresponds to the start code is required. As a result, the number of circuit elements inevitably increases.

In contrast with this, in the case of the detection at the "b" node, no prediction circuit is required. However, since the inputted picture data to be detected have been shifted irregularly in order to form the fixed length conversion output signals on the basis of the variable length picture data, the byte alignment has been already destroyed. Therefore, the start codes must be checked over all the pattern in unit of bit. Accordingly, the scale of the detecting circuit becomes as large as eight times, as compared with the node "a" detection at which the start codes can be detected in the byte alignment state.

FIG. 4 shows a prior art start code detecting circuit used for the node "b" detection. Although not described in detail herein because being well known, in brief, this circuit shown in FIG. 4 detects the start codes after the picture data have been converted into fixed length data. In more detail, 34-bit data already converted by a barrel shifter 11 are stored in two registers 12 and 13, respectively, and then inputted to a circuit 14 composed of 32 sets of 24-input OR circuits. The output of this circuit 14 is inputted to a 32-input OR circuit 15 to detect the start code. Therefore, the number of elements required for these circuits 14 and 15 also inevitably increases. Here, however, in the case of the "b" node detection, when the shifted data are checked one by one, although the number of circuit elements can be minimized, since the processing time of the entire picture processing LSI increases excessively, it is impossible to realize the real time decoding.

As described above, in the prior art variable length code decoding circuit as shown in FIG. 3, when the start codes are detected at the node "a", there exists a problem in that since the start codes are detected excessively earlier than actually used, the detected start codes are difficult to be used for the succeeding processing. Or else, when the start codes are detected at the node "b", there exists a problem in that since the data to be detected have been already converted into fixed length, the detected start codes are easily detected.

SUMMARY OF THE INVENTION

With these problems in mind, therefore, it is the object of the present invention to provide a variable length code decoding apparatus, which can detect the start codes accurately, while reducing the circuit scale thereof markedly.

To achieve the above-mentioned object, the present invention provides a variable length code decoding apparatus, comprising: an interface section (2) having a plurality of registers (R20, R21, R22) each having a predetermined number of bits, for storing variable length code data in each of the registers in first-in first-out status; a shift circuit (3) for receiving data transferred from a predetermined number of the adjacent registers of said interface section and for shifting the received data by a number of bits corresponding to an applied shift signal, to select a start code head; and a start code detecting circuit (6) for executing detection operation by receiving data supplied from a predetermined number of the adjacent registers of said interface section, by detecting presence or absence of a start code on the basis the received data kept in byte-aligned status to output a start code presence and absence signal, and by outputting a start code shift length signal indicative of a byte from which a head bit of the start code begins in unit of byte, the start code shift length signal being applied to said shift circuit as the shift signal.

Further, it is preferable that the variable length code data are supplied to said interface section (2) via a first-in first-out memory (1) from the outside.

Further, it is preferable that when said start code detecting circuit (6) cannot detect the start code, on the basis of a first-in first-out signal of said start code detecting circuit, the data stored in a plurality of the registers of said interface section are updated in first-in first-out status; after having updated, data supplied from a predetermined number of the registers are inputted to said start code detecting circuit, to execute detection operation of said start code detecting circuit.

Further, it is preferable that said start code detecting circuit (6) executes the detection operation by receiving all of a predetermined number of the data from one of two adjacent registers, and a half of the predetermined number of the data from the other of the two adjacent registers.

Further, it is preferable that the apparatus further comprises switching means for switching a start code detecting mode for detecting the start code to a normal mode for decoding the variable length code data, or vice versa.

Further, it is preferable that the apparatus further comprises a look-up table (4) operative only in the normal mode, a decoding shift rate of said shift circuit being decided on the basis of a control signal according to the shift length signal obtained by said look-up table in response to an output of the shift circuit.

Further, it is preferable that the apparatus further comprises a cumulative addition section (5) for obtaining the control signal by cumulatively adding the shift length signals.

Further, it is preferable that the apparatus further comprises a first multiplexer (MP 1) for selectively outputting the control signal and the start code shift length signal to said shift circuit (3) in such a way that the control signal is outputted in the normal mode and the start code shift length signal is outputted in the start code detection mode.

Further, it is preferable that said cumulative addition section (5) further comprises a second multiplexer (MP2); in the start code detection mode, the start code presence and absence signal of said start code detecting circuit being applied to said first and second multiplexers via a control circuit (7); and when the start code presence and absence signal indicates a presence or absence of the start code, the shift signal being outputted by said first multiplexer or the first-in first-out signal being outputted by said second multiplexer.

Further, it is preferable that the apparatus further comprises switch detecting means for selectively outputting a first carry signal obtained when a cumulatively added number of said cumulative addition section reaches a predetermined number and a second carry signal obtained when said start code detecting section (6) detects no start code, in such a way that the first carrier signal is outputted in the normal mode and the second carry signal is outputted in the start code detection mode.

DETAILED DESCRIPTION OF THE PREFERRED EMBODIMENTS

In the picture compression and extension device, performance more than 10 Mbps is required to satisfy the quality of HDTV level. To realize this performance, it is necessary to decode data coded by variable length codes for each clock. For this purpose, a start code of the continuous variable length code must be detected for each clock. The start code thereof is detected by barrel-shifting the variable length code on the basis of the code length thereof.

Figure 1:
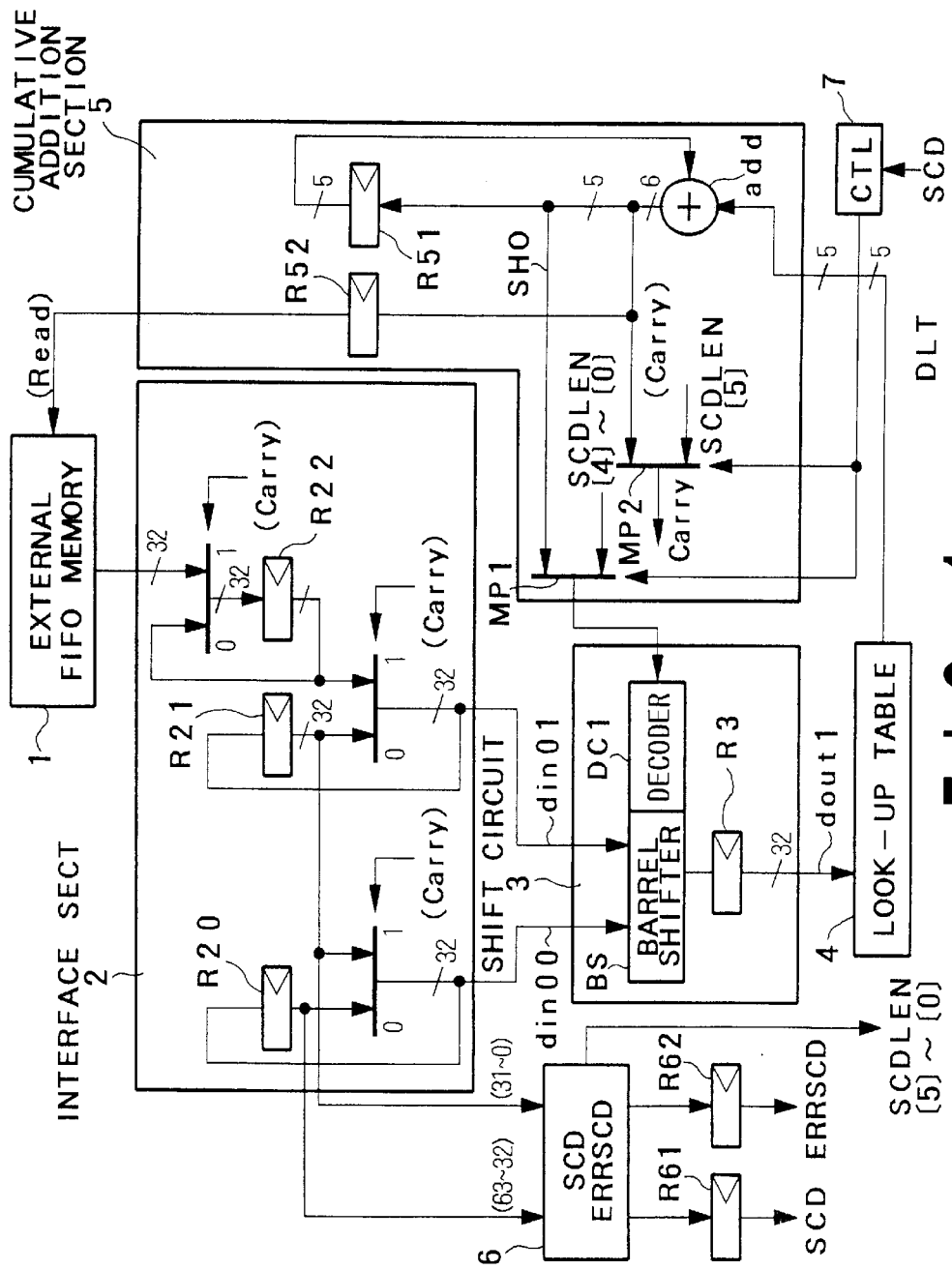
FIG. 1 is a block diagram showing an entire variable length code decoding apparatus according to the present invention.

FIG. 1 shows an embodiment of the VLD (variable length decoder) according to the present invention. In FIG. 1, data given from a FIFO (first-in first-out) memory 1 are applied to a VLD shift circuit 3 via an interface section 2 in unit of 32 bits. To this shift circuit 3, data (decode length) DLT are given from a look-up table 4 via a cumulative addition section 5. Therefore, the shift circuit 3 barrel-shifts (32 bits×2) data to detect the start code thereof. The above-mentioned operation is repeated in sequence. That is, a head shifter section is constructed by the interface section 2, the shifter circuit 3 and the cumulative addition section 5. Since being well known in the art, although the operation thereof is not described in detail herein, the operation thereof can be summarized as follows: (1) data from the FIFO memory 1 are given to the interface section 2 in unit of 32 bits on the basis of a signal Read obtained by the cumulative addition section 5. (2) in the interface section 2, 32 bit-data D0, D1, D2, . . . are stored in three registers R20, R21 and R22, respectively being shifted forward (first-in and first-out mode) in sequence on the basis of a signal Carry given by the cumulative addition section 5. That is, the three 32 bit-data are updated being shifted in sequence in the forward direction. (3) data are given from the registers R20 and R21 to the barrel shifter BS of the shift circuit 3, as input data. (4) the barrel shifter BS shifts the 64 bit-data given by the registers R20 and R21 on the basis of a shift length signal (a code length of the cumulatively-added variable length code) SHO in a range from 10 to 31 bits, and outputs the shifted data as 32 bit data dout1. In other words, the shifts is made on the basis of the decode signal obtained by decoding the shift length signal SHO by the decoder DC1. (5) the shifted data are given to the look-up table via a register R3, and the decode length data DLT are given from the table 4 to the cumulative addition section 5. (6) an adder Add of this cumulative addition section 5 adds the decode length data DLT and the contents of a register R51. (7) when the output (the shift length signal SHO) of the adder is in the normal mode (not the start code detection mode), this output is applied to the shift circuit 3 vial the multiplexer MP1. (8) when the output of the adder Add exceeds "31", a carry signal (Carry)' is outputted. (9) this signal (Carry)' is given to the interface section 2 as the signal Carry via the multiplexer MP2 in the ordinary mode, and further to the FIFO memory 1 via a register R52 as the signal Read, as already explained.

The sections related to the start code detection will be described hereinbelow.

Figure 2:
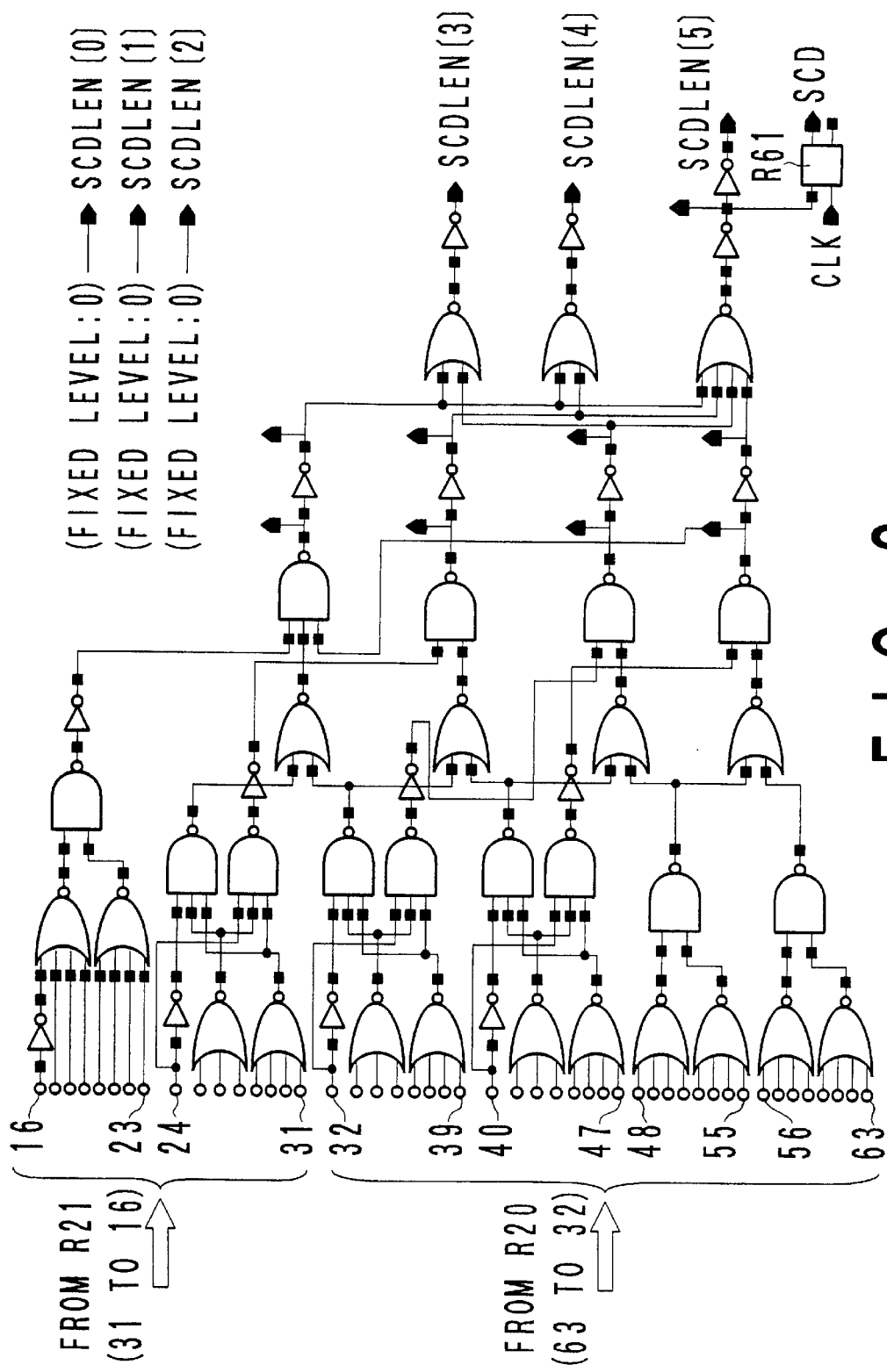
FIG. 2 is a detailed circuit diagram showing the start code detecting circuit shown in FIG. 1.
Figure 3:
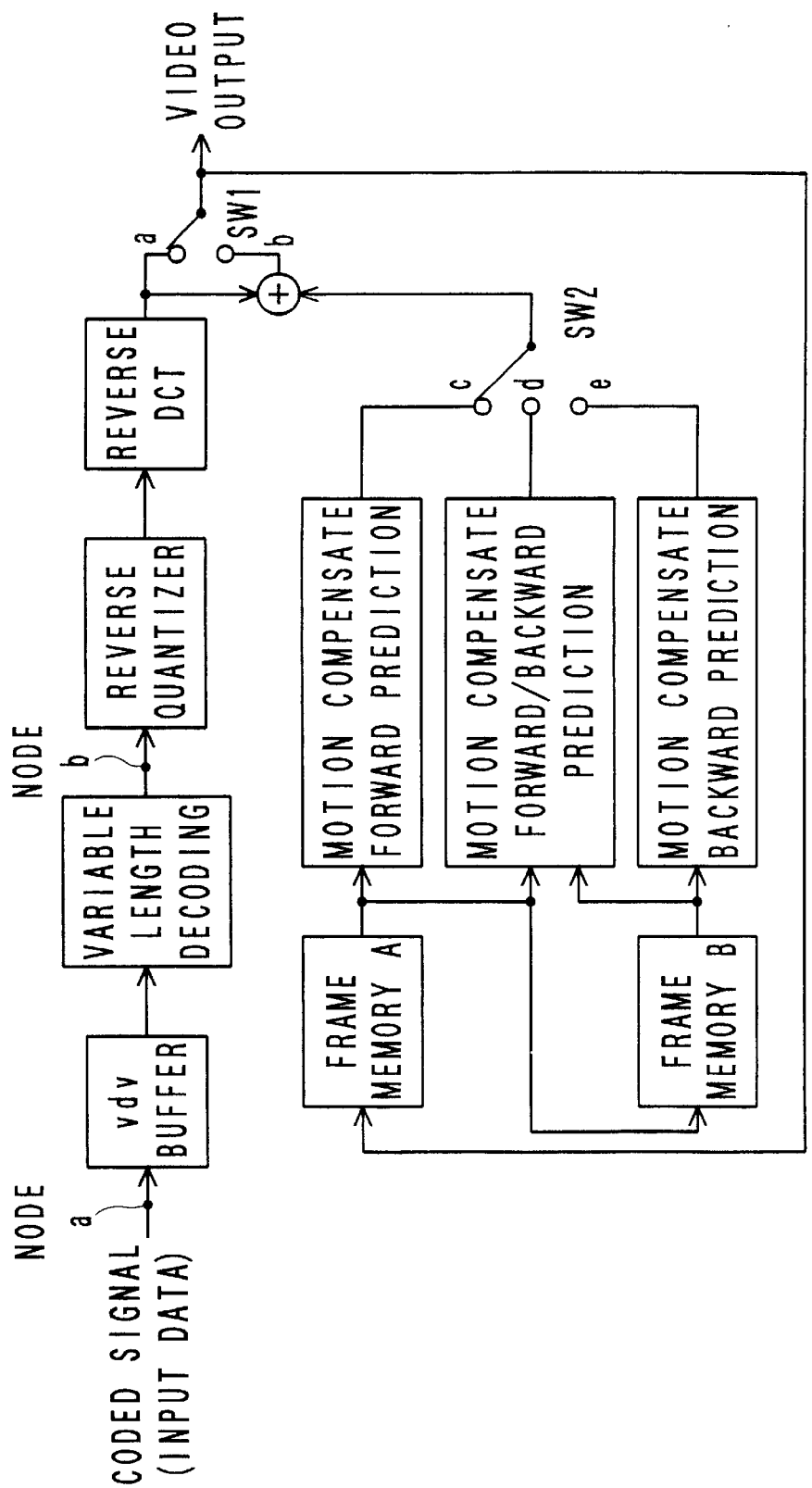
FIG. 3 is a block diagram showing a processing route along which picture signals are decoded.
Figure 4:
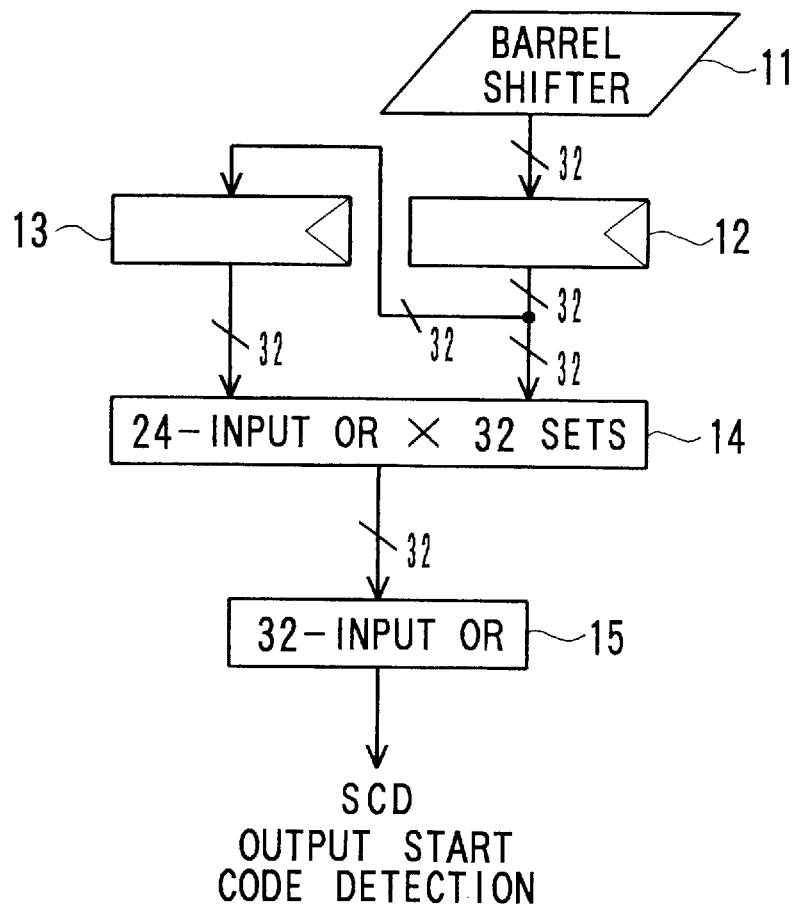
FIG. 4 is a block diagram showing an example of prior art start code detecting circuit.

In the start code detection mode, a start code detecting circuit 6 shown in FIG. 1 begins to operate. The start code detecting circuit 6 receives 64 bit-data (63 to 0) in total from the registers R20 and R21, and outputs data (SCD) and data (SCDLEN [5] to [0]) by use 48 bit data (63 to 16) of the received data. Here, the data (SCD) indicates whether a start code is present or absent, and the data (SCDLEN) indicates a bit from which the start code begins. FIG. 2 shows this start code detecting circuit 6 in further detail. As understood by FIG. 2, the 32 bit-data (63 to 32) are inputted from the register R20 to terminals thereof, and the 16bit-data (31 to 16) are inputted from the register R21 to terminals thereof. The start code detecting circuit 6 obtains logical results of these inputted data, and outputs seven-bit data of SCD, SCDLEN [5] to [0] in total, respectively. The start code signal SCD is at "0" level when the start code is not detected but at "1" when detected. Each of the six-bit start code length signals SCDLEN [5] to [0] indicates a bit (from which the start code begins) of the 48 bit-data (63 to 16) by combination of the levels of "0" and "1", when the start code is detected. Here, the signal SCDLEN [5] is at the "0" level when the signal SCD is at the "1" level (detected), but at the "1" level when SCD is at the "0" level (not detected). Further, the signals SCDLEN [2] to [0] are a "0"-level fixed signal, respectively. The start bit of the start code is indicated by two bits of the signals SCDLEN [4] and [3]. In other words, since the two signals SCDLEN [4] and [3] have four combinations of 00, 01, 10 and 11, the start bits of the start codes are 63, 55, 47 and 39 for each case, respectively. Therefore, the start codes are arranged by 24 bits beginning from this start bit to the smaller number bits. Table 1 below lists the above-mentioned matter.

TABLE

|  | (1) | (2) | (3) | (4) |
|---|---|---|---|---|
| SCDLEN [0] | 0 | 0 | 0 | 0 |
| SCDLEN [1] | 0 | 0 | 0 | 0 |
| SCDLEN [2] | 0 | 0 | 0 | 0 |
| SCDLEN [3] | 0 | 1 | 0 | 1 |
| SCDLEN [4] | 0 | 0 | 1 | 1 |
| SCDLEN [5] | 0 | 0 | 0 | 0 |
| START BIT OF START CODE | 63 | 55 | 47 | 39 |

The start code can be detected as described above. Here, the inputted 48 bit-data are in the status where the byte alignment is not destroyed. Therefore, it is unnecessary to check all the bit patterns by use of the circuit as shown in FIG. 2. In other words, since the start code can be checked in unit of byte, so that it is possible to reduce the circuit scale of the start code detecting circuit 6 as shown in FIG. 2 down to about ⅛ of the prior art start code detecting circuit for checking all the bit patterns. Further, as understood by FIG. 1, since the signal SCD is outputted from the start code detecting circuit 6 via a register R61, it is possible to detect the start code immediately before the start code is processed. In addition, the circuit shown in FIG. 2 is of such structure that the start code can be detected by checking the input pattern in unit of byte when seen from the standpoint of byte unit. In the circuit shown in FIG. 2, although the start code shift length signals SCDLEN [5] to [0] can be also outputted, since this output is also of byte unit, three lower significant bits of SCDLEN [2] to [0] are always kept at the "0" level; that is, since it is unnecessary to output these three lower significant bits by constructing a logical circuit, the logical circuit can be simplified to that extent.

In FIG. 1, the start code detection signals SCD and the start code shift length signals SCDLEN [5] to [0] all detected by the start code detecting circuit 6 are applied to a control circuit 7 and the cumulative addition section 5. When the start code detection signal SCD indicates the start code presence or absence signal in the start code detection mode, the control circuit 7 selectively outputs the start code length signals SCDLEN [4] to [0] or SCDLEN [5] from the two multiplexers MP 1 and/or MP 2 on the basis of logical results in association with various other control signals (not shown). Since these signals SCD and SCDLEN [5] to [0] have the above-mentioned levels, respectively, when the start code is not detected, the signal SCDLEN [5] is at the "1" level, so that the interface section 2 transfers 32 bit-data in first-in first-out mode. On the other hand, when the start code is not detected, data are shifted by the shift circuit 3 by a shift amount according to the signals SCDLEN [4] to [0].

Further, when an 8bit-error code is added to the 24 bit-start codes in compliance with the MPEG2, the error code is detected by an error code detecting function section incorporated in the start code detecting circuit 6. Further, the detected error code is outputted via a register R62 as an error code detection signal ERRSCD.

As described above, in the variable length decoding apparatus according to the present invention, when the start code is detected from picture data compressed and coded in variable length, it is possible to detect the start code from the picture data in such a state that the byte alignment is not destroyed and by a circuit not far from the circuit for using the detected start code, with the result that the circuit scale can be reduced and further the detected start code can be used easily for the succeeding processing.

The apparatus of FIG. 1 has a switching circuit in a control circuit 7, for switching a novel mode for decoding the variable length code data to a start code detecting mode for detecting the start code, or vice versa.

What is claimed is:

1. A variable length code decoding apparatus, comprising:
   an interface section (2) having a plurality of adjacent registers (R20, R21, R22) each having a predetermined number of bits, for storing variable length code data kept in byte-aligned status in each of the registers in first-in, first-out status;
   a shift circuit (3) for receiving data kept in byte-aligned status and transferred from a predetermined number of the adjacent registers of said interface section and for shifting the received data by a number of bits corresponding to an applied shift signal; and
   a start code detecting circuit (6) connected to the interface section (2) in parallel with the shift circuit (3), for executing a detection operation by receiving data supplied from a predetermined number of the adjacent registers of said interface section, by detecting presence or absence of a start code on the basis of the received data kept in byte-aligned status to output a start code presence and absence signal, and by outputting a start code shift length signal indicative of a byte from which a head bit of the start code begins, the start code shift length signal being applied to said shift circuit as the applied shift signal.

2. The variable length code decoding apparatus of claim 1, wherein the variable length code data are supplied to said interface section (2) via a first-in first-out memory (1) from the outside.

3. The variable length code decoding apparatus of claim 1, wherein when said start code detecting circuit (6) cannot detect the start code, on the basis of a first-in first-out signal of said start code detecting circuit, the data stored in a plurality of the registers of said interface section are updated in first-in first-out status; after having updated, data supplied from a predetermined number of the registers are inputted to said start code detecting circuit, to execute detection operation of said start code detecting circuit.

4. The variable length code decoding apparatus of claim 3, wherein said apparatus is adapted to switch a start code detecting mode for detecting the start code to a normal mode for decoding the variable length code data, or vice versa.

5. The variable length code decoding apparatus of claim 4, which further comprises a look-up table (4) operative only in the normal mode, a decoding shift amount of said shift circuit being decided on the basis of a control signal according to the shift length signal obtained from said look-up table in response to an output of the shift circuit.

6. The variable length code decoding apparatus of claim 5, which further comprises a cumulative addition section (5) for obtaining the control signal by cumulatively adding the shift length signals.

7. The variable length code decoding apparatus of claim 1, wherein said start code detecting circuit (6) executes the detection operation by receiving all of a predetermined number of the data from one of two adjacent registers, and a half of the predetermined number of the data from the other of the two adjacent registers.

8. The variable length code decoding apparatus of claim 1, wherein said apparatus is adapted to switch a start code detecting mode for detecting the start code to a normal mode for decoding the variable length code data, or vice versa.

9. The variable length code decoding apparatus of claim 8, which further comprises a look-up table (4) operative only in the normal mode, a decoding shift amount of said shift circuit being decided on the basis of a control signal according to the shift length signal obtained from said look-up table in response to an output of the shift circuit.

10. The variable length code decoding apparatus of claim 9, which further comprises a cumulative addition section (5) for obtaining the control signal by cumulatively adding the shift length signals.

11. The variable length code decoding apparatus of claim 10, which further comprises a first multiplexer (MP 1) for selectively outputting the control signal and the start code shift length signal to said shift circuit (3) in such a way that the control signal is outputted in the normal mode and the start code shift length signal is outputted in the start code detection mode.

12. The variable length code decoding apparatus of claim 11, wherein said cumulative addition section (5) further comprises a second multiplexer (MP 2); in the start code detection mode, the start code presence and absence signal of said start code detecting circuit being applied to said first and second multiplexers via a control circuit (7); and when the start code presence and absence signal indicates a presence or absence of the start code, the shift signal being outputted by said first multiplexer or the first-in first-out signal being outputted by said second multiplexer.

13. The variable length code decoding apparatus of claim 10, which further comprises switch detecting means for selectively outputting a first carry signal obtained when a cumulatively added number of said cumulative addition section reaches a predetermined number and a second carry signal obtained when said start code detecting section (6) detects no start code, in such a way that the first carrier signal is outputted in the normal mode and the second carry signal is outputted in the start code detection mode.

14. The variable length code decoding apparatus of claim 9, which further comprises a first multiplexer (MP 1) for selectively outputting the control signal and the start code shift length signal to said shift circuit (3) in such a way that the control signal is outputted in the normal mode and the start code shift length signal is outputted in the start code detection mode.

15. The variable length code decoding apparatus of claim 14, wherein said cumulative addition section (5) further comprises a second multiplexer (MP 2); in the start code detection mode, the start code presence and absence signal of said start code detecting circuit being applied to said first and second multiplexers via a control circuit (7); and when the start code presence and absence signal indicates a presence or absence of the start code, the shift signal being outputted by said first multiplexer or the first-in first-out signal being outputted by said second multiplexer.

16. The variable length code decoding apparatus of claim 9, which further comprises switch detecting means for selectively outputting a first carry signal obtained when a cumulatively added number of said cumulative addition section reaches a predetermined number and a second carry signal obtained when said start code detecting section (6) detects no start code, in such a way that the first carrier signal is outputted in the normal mode and the second carry signal is outputted in the start code detection mode.

* * * * *